(12) United States Patent
Ham et al.

(10) Patent No.: US 7,548,063 B2
(45) Date of Patent: Jun. 16, 2009

(54) DETUNING OF AN RF SHIELDED MRI SCAN ROOM

(75) Inventors: Cornelis Leonardus Gerardus Ham, Eindhoven (NL); Miha Fuderer, Eindhoven (NL); Marinus Ludovicus Adrianus Vrinten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/913,804

(22) PCT Filed: Apr. 28, 2006

(86) PCT No.: PCT/IB2006/051331

§ 371 (c)(1),
(2), (4) Date: Nov. 7, 2007

(87) PCT Pub. No.: WO2006/120594

PCT Pub. Date: Nov. 16, 2006

(65) Prior Publication Data

US 2008/0197847 A1    Aug. 21, 2008

(30) Foreign Application Priority Data

May 9, 2005    (EP)    .................................... 05103810

(51) Int. Cl.
*G01V 3/00*    (2006.01)
(52) U.S. Cl. ........................................ 324/318; 324/319
(58) Field of Classification Search ......... 324/300–323; 600/407–422; 355/282, 296, 216; 128/653.5
See application file for complete search history.

(56) References Cited

U.S. PATENT DOCUMENTS

| 4,651,099 | A | | 3/1987 | Vinegar et al. |
| 5,583,318 | A | * | 12/1996 | Powell ........................ 174/390 |
| 5,717,371 | A | * | 2/1998 | Crow .......................... 335/216 |
| 6,317,618 | B1 | * | 11/2001 | Livni et al. .................. 600/410 |
| 6,650,116 | B2 | * | 11/2003 | Garwood et al. ............ 324/309 |
| 6,825,611 | B2 | * | 11/2004 | Kobayashi et al. .......... 313/504 |
| 6,825,661 | B2 | * | 11/2004 | Leussler ..................... 324/318 |
| 7,246,681 | B2 | * | 7/2007 | Christen .................... 181/285 |
| 2003/0001572 | A1 | | 1/2003 | Leussler |
| 2004/0026162 | A1 | | 2/2004 | Christen |

FOREIGN PATENT DOCUMENTS

| JP | 03077173 A | 4/1991 |
| WO | 2004041306 A2 | 5/2004 |
| WO | 2005043181 A1 | 5/2005 |

* cited by examiner

*Primary Examiner*—Brij B Shrivastav

(57) ABSTRACT

The present invention relates to a system and method magnetic resonance (MR) imaging. Furthermore the invention relates to the use of a material and to a computer program. In order to provide a technique which allows to prevent standing waves in an RF cage (3) of a MR imaging system (1) in a very cheap and simple way a MR imaging system (1) is suggested, which comprises a MR imaging apparatus (2) comprising an open magnet system (7), wherein operation of the MR imaging apparatus (2) creates a magnetic resonance field having a MR frequency, and which further comprises an RF cage (3), configured to enclose the MR imaging apparatus (2), wherein the walls (6) of the RF cage (3) are at least partly provided with a covering (5, 10), said covering (5, 10) is adapted in a way that the wavelength of the MR frequency within the covering (5, 10) is reduced.

16 Claims, 2 Drawing Sheets

DETUNING OF AN RF SHIELDED MRI SCAN ROOM

Figure 1:
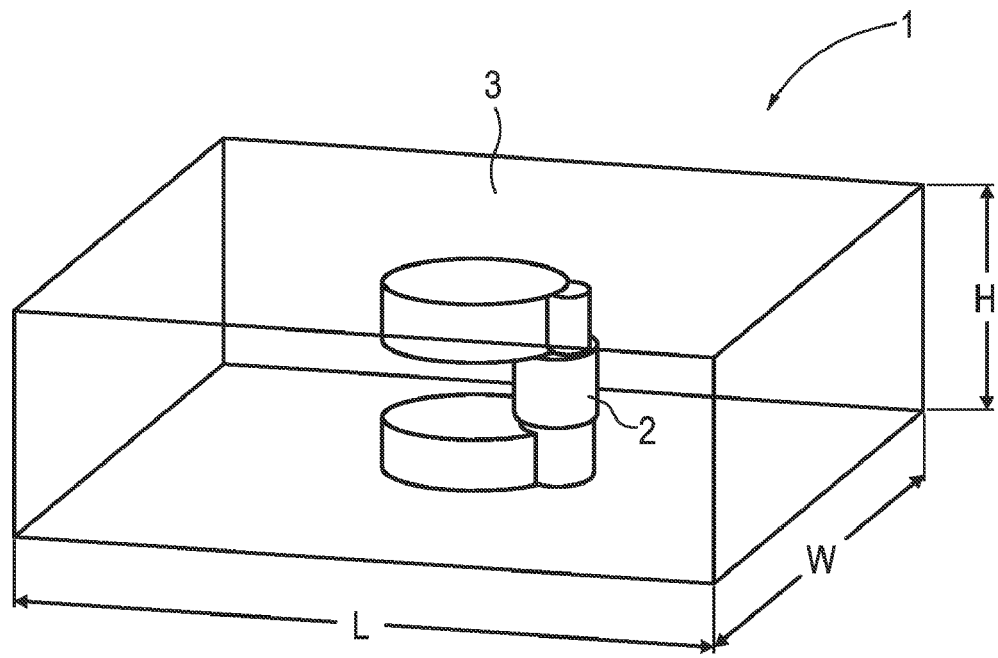

The present invention relates to a system and method of magnetic resonance (MR) imaging. Furthermore the invention relates to the use of a material and to a computer program.

MR imaging systems with cylindrical magnets are well known in the prior art for many years. Also MR imaging systems with open magnet systems have been used for some time. However such open systems did normally work with low magnetic fields, e.g. 0.1 Tesla. The MR frequency for such a low field system is typically 8.2 MHz.

For an increase of image quality, now open systems are suggested, which use a relatively high magnetic field (1 Tesla). In this case the MR frequency is approximately 42.3 MHz. A MR imaging apparatus comprising such an open magnet system is described in U.S. Pat. No. 6,825,661. Such an open magnet system includes two distinct parts (an upper section and a lower section). The object to be examined (a patient) is arranged between those sections.

Due to the design of the open magnet system, electromagnetic energy, which is transmitted by the RF transmitter of the system in order to excite spins in the protons, is radiated more or less freely to the surrounding space. For this reason, and for reason of shielding external signals during signal reception, the open magnet system is placed in a faraday cage (RF cage). However, if the RF cage is of an unfortunate size, this will lead to RF resonances and the RF transmitter will cause standing waves within the RF cage. For example in a 1 Tesla-MR system, with the proton-MR frequency being approximately 42.3 MHz, the half-wavelength in air is about 3.5 m. The dimensions of the cage, which has "reflective" walls in terms of RF, can lead to standing waves.

Those standing RF waves will affect other persons in the room (operators, patient's relatives, etc.). Those persons will receive an unacceptable load of RF energy. Also the image quality is decreased, caused by a reduced orthogonality of the RF field in the imaging volume. Additionally the loss of orthogonality will result in a more linearly polarized magnetic RF field, which for a given spin excitation will lead to a larger specific absorption rate (SAR) for the patient than in the case of a perfect circularly polarized field.

The current practice is to prevent standing waves by very restrictive installation conditions, e.g. restrictions on the position of the magnet system in the room, applying a conductive false ceiling on a fixed height or limitations on the dimensions (width and length) of the RF cage. However, it is not only practical to change the size of the RF cage.

In U.S. Pat. No. 6,825,661 it is suggested to use a layer of foam on the inner side of all walls, the floor and the ceiling, the foam acting as an absorber material. However, it has been found, that the use of an absorber material has a negative effect on image quality.

It is an object of the present invention to provide a technique which prevents standing waves in a very cheap and simple way.

This object is achieved by a MR imaging system. The system comprises a MR imaging apparatus comprising an open magnet system, wherein operation of the MR imaging apparatus creates a magnetic resonance field having a MR frequency. The system further comprises an RF cage, configured to enclose the MR imaging apparatus, wherein the walls of the RF cage are at least partly provided with a covering, said covering is adapted in a way that the wavelength of the MR frequency within the covering is reduced.

The object is also achieved by a MR imaging method, wherein a MR imaging apparatus is used for generating MR images, said MR imaging apparatus comprising an open magnet system, wherein operation of the MR imaging apparatus creates a magnetic resonance field having a MR frequency, wherein an RF cage is used for shielding purposes, said RF cage being configured to enclose the MR imaging apparatus, and wherein the walls of the RF cage are at least partly provided with a covering, said covering is adapted in a way that the wavelength of the MR frequency within the covering is reduced.

The effective length (in terms of the number of RF wavelength) of at least one dimension of the RF cage is changed in a way that standing waves are avoided. This is achieved by using a covering to the inner side of at least one part of a wall of the RF cage. Said covering comprises at least one material, in which the wavelength of the MR frequency is substantially shorter than in air.

This new approach provides a cheap and simple solution. By using cheap covering materials and using a comparatively simply layout, a "wave delay" can be reached by "lengthening" or "widening" of the RF cage. Since standing waves can be avoided effectively, the exposure to RF energy is minimized for the operator etc. Furthermore the image quality is enhanced and the SAR for the patient is not increased needlessly. Negative effects on image quality are not known. Another advantage is that the MR imaging is far less sensitive to changes in the geometry of the RF cage, for example when auxiliary equipment is set up or moved or when operating staff moves in the RF cage.

It is possible to "detune" every existing RF cage in such a way that it can be used in combination with an open MR imaging system. When a previous MR imaging system is replaced by a new MR imaging system that has a different RF behavior, the existing RF cage adapted to the new MR imaging system. Hence it is avoided that a new RF cage must be built.

It is to be understood, that the covering could be provided to the floor or to the ceiling as well. However, providing the covering to the wall will be in most cases the cheapest way.

These and other aspects will be further elaborated on the basis of the following embodiments which are defined in the dependent claims.

According to a preferred embodiment the covering comprises one or more materials having a high dielectric constant $\in_r$ and/or a high magnetic permeability $\mu_r$. In other words material is used, where the wavelength of the MR frequency is substantially shorter than in air. This can be reached in principal by changing either the dielectric constant or the magnetic permeability or both. In other words a "delaying material" is used, i.e. a material with a different $\in_r$ or $\mu_r$ as air. With both approaches $\in_r / \mu_r$ the same effect can be reached.

For reasons of economy covering materials with a high magnetic permeability may not be used very frequently. For example iron could be used, either as bulk material or in form of small iron particles put into a foam or the like.

In the following the use of covering materials with a high dielectric constant will be described in more detail.

According to another embodiment, the covering comprises one or more materials having a dielectric constant $\in_r$ in the range of about 2 to about 81. The lower limit has been set by practical reasons due to the fact that the wavelength goes with the square root of $\in_r$. If a material with a smaller $\in_r$ would be used, a very thick covering would be needed, which would negatively affect the free space available within the RF cage. A reasonable upper limit of $\in_r$ would be 81, since the $\in_r$ of one of the cheapest materials (water) is about 80 (approximately 80.1 at a temperature of 18° C.) and any other material with an $\in_r$ above that figure will be very expensive compared to water.

Other cheap materials, which are preferably used for the covering are $\in_r$-values in brackets): glycerol (42.5), methanol (32.6), wet soil (29), dry wood (2-3), glass (6-8) and several types of plastics or foam.

Depending on the material the thickness of the covering has to be determined such, that a sufficient "lengthening" or "widening" of the RF cage ("detuning" of the RF cage) is reached.

According to another embodiment, the covering comprises a stack of crates of water bottles. In this embodiment, simply a number of crates of water bottles are used. Preferably they are placed on one wall of the RF cage. This mixture of air and water forms a covering, which will lead to destructive interferences between the RF waves.

According to another embodiment, the covering comprises not only a singly part of homogenous material, but at least two parts arranged consecutively from the inside of the RF cage to the RF cage wall, wherein the dielectric constant $\in_r$ or magnetic permeability $\mu_r$ of those parts, which are far from the wall, are smaller than the dielectric constant $\in_r$ or magnetic permeability $\mu_r$ of those parts, which are near the wall. In this "multi-layer" approach different materials are used with respect to the reflection of RF waves. The aim of this approach is to reduce the reflection of RF energy at the air/covering interface. A typical embodiment comprises a wall stacked with layers of material, where that material closest to the wall has the highest dielectric constant. In other words, too much reflection of the RF waves is prevented from taking place at the first boundary.

The layout of the covering and the positioning of the covering are complex optimization problems, which are solved with a simulation program. Therefore the object is also achieved by a computer program for optimizing a MR imaging system, said system comprising a MR imaging apparatus comprising an open magnet system, wherein operation of the MR imaging apparatus creates a magnetic resonance field having a MR frequency, said system further comprising an RF cage, configured to enclose the MR imaging apparatus, wherein the walls of the RF cage are at least partly provided with a covering, said covering is adapted in a way that the wavelength of the MR frequency within the covering is reduced, comprising computer program instructions to optimize the layout and/or the position of the covering, when the computer program is executed in a computer.

These technical effects can thus be realized on the basis of the instructions of the computer program. Such a computer program can be stored on a carrier such as a CD-ROM or it can be available over the internet or another computer network. Prior to executing, the computer program is loaded into the computer by reading the computer program from the carrier, for example by means of a CD-ROM player, or from the internet, and storing it in the memory of the computer. The computer includes inter alia a central processor unit (CPU), a bus system, memory means, e.g. RAM or ROM etc., storage means, e.g. floppy disk or hard disk units etc. and input/output units. Alternatively the method could be implemented in hardware, e.g. using one or more integrated circuits.

Figure 2:
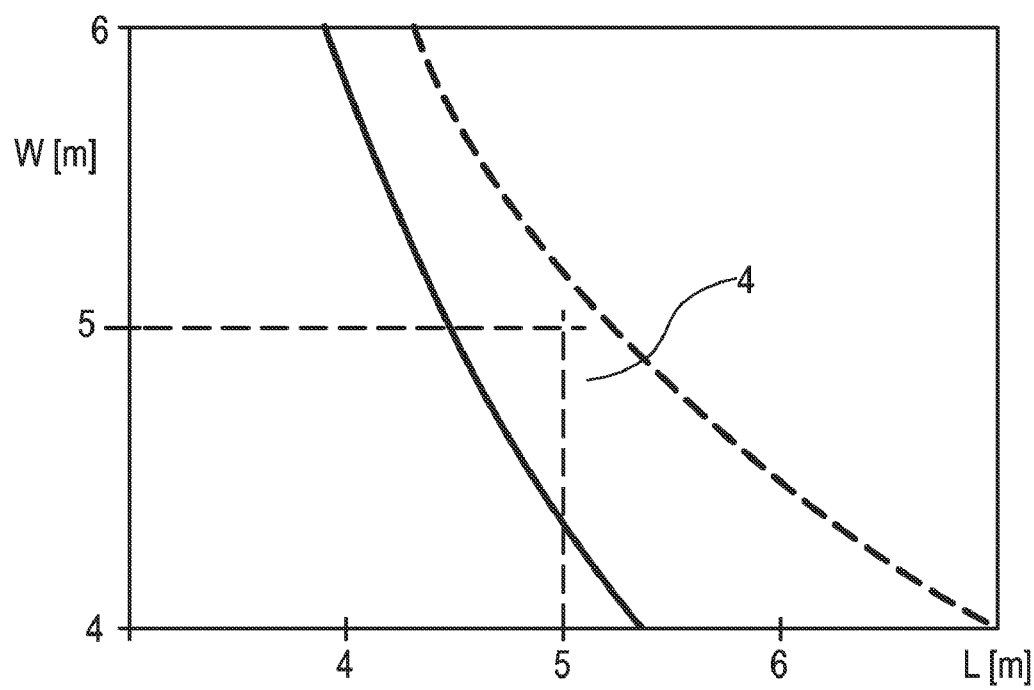
Figure 3:
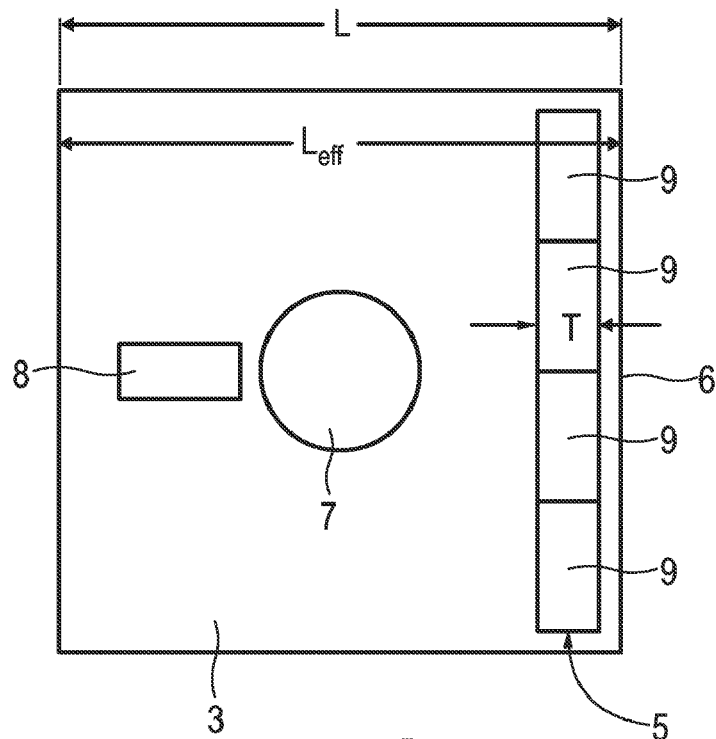
Figure 4:
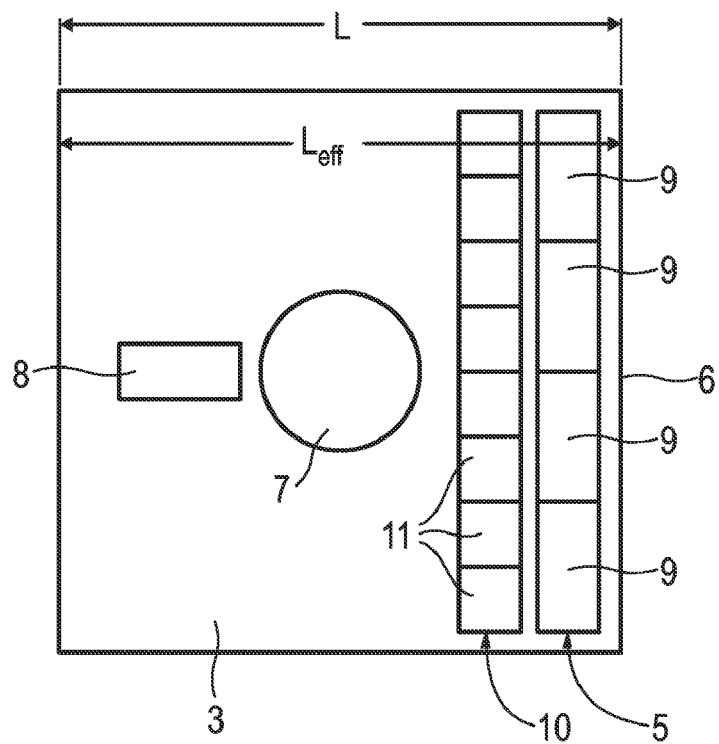

These and other aspects of the invention will be described in detail hereinafter, by way of example, with reference to the following embodiments and the accompanying drawings; in which:

FIG. 1 shows a schematic representation (perspective view) of a MR imaging system, FIG. 2 shows a schematic graph illustrating the "forbidden area" for an RF cage, FIG. 3 shows a schematic representation (top view) of an RF cage with a covering, and FIG. 4 shows a schematic representation (top view) of an RF cage with another covering.

FIG. 1 shows a MR imaging system 1, comprising a MR imaging apparatus 2 and an RF cage 3, which encloses the MR imaging apparatus 2. The MR imaging apparatus 2 comprises an open magnet system working at 1 Tesla and is configured to operate at a MR frequency of approximately 42 MHz. Height (H), width (W) and length (L) of the RF cage 3 are in most cases predetermined by local conditions. Typical dimensions are 5 by 5 by 3 meters. Such dimensions lead in the case of a 42 MHz working frequency to standing RF waves within the RF cage 3.

The graph shown in FIG. 2 illustrates the "forbidden area" 4, not allowed to be used for an RF cage. The graph in FIG. 2 merely serves as an example for illustration purposes. It can be seen, that a RF cage with 4 by 4 meters is allowed as well as a RF cage with 6 by 6 meters. However, a RF cage with 5 by 5 meters is not allowed.

In the illustrated embodiment the RF cage 3 shows such a 5 by 5 meters design, see FIG. 3. With the presently described technique, it is possible to use the RF cage 3 for the above-mentioned MR imaging apparatus 2, comprising a magnet 7 and a patient carrier 8. For this purpose simply a covering 5 is applied to one of the walls 6 of the RF cage 3. The covering 5 is adapted in a way that the wavelength of the MR frequency within the covering is reduced. For this purpose a number of containers 9 are placed in front of the wall 6, building up a second "inner wall". The container 9 is filled with pure water. The thickness T of the containers 9 is approximately 20 cm. Taking into account the $\in_r$ of water (80) this 20 cm of containers 9 will have the same effect as about 20 cm* 80=179 cm of air. In other words the "effective length" $L_{eff}$ of the RF cage 3 (in terms of RF wavelengths) has been changed. No standing waves will occur. A very decorative solution is reached, if aquariums are used as containers 9.

In another setup a "multi-layer" approach is used, see FIG. 4. Again a first "inner wall" is provided using containers 9 containing water. Furthermore a second covering 10 is provided just in front of the first "inner wall". This second covering 10 again is made of a number of containers 11. The thickness of the containers 11 is approximately 15 cm. Those second containers 11 contain a material showing an $\in_r$ in between that of water (80) and that of air (1). For example the second containers 11 contain wet soil (29). Alternatively the second covering 10 is made of 15 cm thick glass (6-8). In a very simply embodiment the second covering 10 is made from a stack of crates of water bottles, whereas the mixture of water and air acts as "material" with an intermediate $\in_r$.

The coverings 5, 10 do not necessarily need to reach the ceiling of the RF cage 3. In many cases it is also not necessary that the wall 6 is fully covered. In some cases it might even adequate to cover a corner of the RF cage 3, i.e. covering small parts of two walls. If, for example, only half the area of a wall is covered with water filled containers of 20 cm thickness (corresponding approximately to a quarter of the RF wavelength for 42 MHz), destructive interferences between the RF wave on the covered part and the RF wave on the uncovered part of the wall occur. Because of those interferences, no standing waves are built.

Instead of building "inner walls" 5, 10 in front of the real walls 6 of the RF cage 3, it is also possible to apply the covering directly to the RF cage walls 6. If, for example, a foam is used as covering material, the foam may be e.g. sputtered on the wall 6 to form a (e.g. 20 cm) covering layer.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" do not exclude a plurality, and that a single element, such as a computer system or another unit may fulfill the functions of several means recited in the claims. Any reference signs in the claims shall not be construed as limiting the claim concerned.

The invention claimed is:

1. A magnetic resonance (MR) imaging system, comprising:
    a MR imaging apparatus,
    an RF cage, enclosing the MR imaging apparatus, walls of the RF cage reflecting RF waves and being at least partly provided with a covering, said covering being configured such that a wavelength of the RF waves is reduced in the covering to avoid standing waves in the RF cage.

2. The MR imaging system as claimed in claim 1, wherein the covering comprises one or more materials having a dielectric constant $\in_r$ in the range of 2 to 81.

3. The MR imaging system as claimed in claim 1, wherein the covering comprises liquid water.

4. The MR imaging system as claimed in claim 1, wherein the covering comprises a stack of crates of water bottles.

5. The MR imaging system as claimed in claim 1, wherein the covering comprises at least two pails arranged consecutively from the inside of the RF cage to the RF cage wall, wherein the dielectric constant $\in_r$ or magnetic permeability $\mu_r$ of those parts, which are far from the wall, are smaller than the dielectric constant $\in_r$ or magnetic permeability $\mu_r$ of those pads, which are near the wall.

6. The MR imaging system as claimed in claim 1, wherein the MR imaging apparatus is configured to generate:
    a magnetic field; and
    RF waves at a predefined MR frequency.

7. The MR imaging system as claimed in claim 6, wherein the covering is configured to cause destructive influence between the RF waves at the MR frequency.

8. The MR imaging system as claimed in claim 6, wherein the covering is configured to prevent standing RF waves at the MR frequency by changing the wavelength rather than absorbing the MR frequency RF waves.

9. The MR imaging system as claimed in claim 1, wherein the MR imaging apparatus includes an open magnet system that creates a magnetic field.

10. A computer-readable medium carrying a computer program for optimizing a magnetic resonance imaging system, said system comprising a MR imaging apparatus comprising an open magnet system, wherein operation of the MR imaging apparatus creates a magnetic resonance field and generates resonance signals of a predetermined RF frequency, said system further comprising an RF cage, configured to enclose the MR imaging apparatus, wherein the walls of the RF cage are at least partly provided with a covering, said covering is configured in a way that a wavelength of the RF frequency within the covering is reduced, the computer program including instructions for optimizing a layout and/or position of the covering to reduce standing waves in the RF cage, when the computer program is executed in a computer.

11. A magnetic resonance (MR) imaging system, comprising:
    a MR imaging apparatus used for generating MR images, said MR imaging apparatus generates RF waves at a MR frequency;
    an RF cage, configured to enclose the MR imaging apparatus, wherein the walls of the RF cage reflect the RF waves and produce standing waves at the MR frequency; and
    a covering is provided or at least partially provided on the walls of the RF cage and configured to shorten a wavelength of the reflected RF waves such that the generated and reflected RF waves do not interact to form standing RF waves at the MR frequency in the RF cage.

12. The magnetic resonance system as claimed in claim 11, wherein the covering includes:
    a first part closer to an inside of the RF cage and further from the wall of the RF cage; and
    a second part closer to the wall of the RF cage than the first part;
    wherein one of a of a dielectric constant $\in_r$ or a magnetic permeability $\mu_r$ of the first part is smaller than a dielectric constant $\in_r$ or a magnetic permeability $\mu_r$ of the second part.

13. The magnetic resonance system as claimed in claim 11, wherein the covering includes a plurality of containers, each container containing a material with a dielectric constant between 2 and 81.

14. The magnetic resonance system as claimed in claim 13, wherein the containers contain sufficient water to reduce the wavelength of the reflected RF waves sufficiently to cause destructive interference at the MR frequency.

15. A method of eliminating standing RF weaves at an MR frequency in an RF cage that surrounds an MR imaging apparatus, the method comprising:
    generating RF waves with the MR imaging apparatus at the MR frequency;
    reflecting the RF waves from walls of the RF cage;
    with a covering on at least one wall of the RF cage, reducing a wavelength of the RF waves in the covering such that the RF waves destructively interference to eliminate the standing RF waves at the MR frequency.

16. The method as claimed in claim 15, wherein the covering has two parts including a part closer to the wall of the RF cage and a part farther from the wall and the method further includes;
    reducing the wavelength of the RF waves a first amount with the part farther from the wall;
    reducing the wavelength of the RF waves a second amount with the part closer to the wall, the first amount being less than the second amount to reduce reflection of the RF waves from the part farthest from the wall.

* * * * *